(12) United States Patent
Fan et al.

(10) Patent No.: US 9,633,775 B2
(45) Date of Patent: Apr. 25, 2017

(54) ELECTRONIC DEVICE MOUNTING APPARATUS

(71) Applicant: BOTHHAND ENTERPRISE INC., Tainan (TW)

(72) Inventors: Chung-Cheng Fan, Taoyuan (TW); Yung-Ming Pan, Taoyuan (TW)

(73) Assignee: BOTHHAND ENTERPRISE INC., Tainan (TW)

( * ) Notice: Subject to any disclaimer, the term of this patent is extended or adjusted under 35 U.S.C. 154(b) by 86 days.

(21) Appl. No.: 14/705,644

(22) Filed: May 6, 2015

(65) Prior Publication Data

US 2015/0327385 A1 Nov. 12, 2015

(30) Foreign Application Priority Data

May 7, 2014 (TW) .............................. 103207933 U (51) Int. Cl.

| H01F 27/02 | (2006.01) |
|---|---|
| H01R 4/24 | (2006.01) |
| H05K 5/02 | (2006.01) |
| F16L 3/06 | (2006.01) |
| H01F 27/29 | (2006.01) |
| H01F 17/06 | (2006.01) |

(52) U.S. Cl.
CPC .............. *H01F 27/027* (2013.01); *F16L 3/06* (2013.01); *H01F 27/29* (2013.01); *H05K 5/0247* (2013.01); *H01F 17/06* (2013.01)

(58) Field of Classification Search
CPC ... H01F 27/027; H01F 27/29; H01R 13/6633; H01R 4/2429; H01R 4/2925; H01R 4/242; H05K 5/0247

USPC .......... 336/90, 192, 107; 439/395, 942, 719, 439/718

See application file for complete search history.

(56) References Cited

U.S. PATENT DOCUMENTS

| 3,486,076 | A | * | 12/1969 | Abbott | ................... | H05K 3/222 |
| | | | | | | 174/251 |
| 3,721,747 | A | * | 3/1973 | Renskers | ................ | H01F 27/29 |
| | | | | | | 174/532 |
| 5,015,981 | A | * | 5/1991 | Lint | ...................... | H01F 27/027 |
| | | | | | | 29/602.1 |
| 5,254,808 | A | * | 10/1993 | Rodrigues | ................ | H02B 1/26 |
| | | | | | | 174/660 |
| 5,441,224 | A | * | 8/1995 | Ludwig | ................... | G09F 13/28 |
| | | | | | | 248/74.2 |

(Continued)

*Primary Examiner* — Leslie A Nicholson, III
*Assistant Examiner* — Kimberley S Wright
(74) *Attorney, Agent, or Firm* — Muncy, Geissler, Olds & Lowe, P.C.

(57) ABSTRACT

An electronic device mounting apparatus to be mounted with multiple electronic components, each of which includes at least one wire. The electronic device mounting apparatus includes a base unit and multiple pin units. The base unit includes a base wall and two side walls extending from the base wall. Each of the side walls has a first surface. The pin units are correspondingly mounted in the side walls and are spaced apart from one another. Each of the pin units has a wire-connecting segment having a connection portion that projects from the first surface, and two projecting portions that project from the connection portion and that define a slit therebetween. The slit is for a corresponding wire to be clamped therein by the projecting portions.

14 Claims, 11 Drawing Sheets

(56) References Cited

U.S. PATENT DOCUMENTS

| | | | | |
|---|---|---|---|---|
| 5,521,124 A * | 5/1996 | Tai | H01L 23/3107 | 257/E23.044 |
| 5,656,985 A * | 8/1997 | Lu | H01F 27/027 | 174/561 |
| 6,005,463 A * | 12/1999 | Lint | H01F 27/027 | 336/192 |
| 6,149,050 A * | 11/2000 | Lai | B23K 1/08 | 228/180.1 |
| 6,297,721 B1 * | 10/2001 | Lu | H01F 27/027 | 336/192 |
| 6,319,064 B1 * | 11/2001 | Belopolsky | H01R 13/41 | 439/620.19 |
| 6,431,903 B1 * | 8/2002 | Dittmann | H01R 4/242 | 439/395 |
| 6,593,840 B2 * | 7/2003 | Morrison | H01F 27/292 | 336/192 |
| 6,729,906 B1 * | 5/2004 | Simmons | H01R 13/65802 | 439/490 |
| 6,811,442 B1 * | 11/2004 | Lien | H01R 13/719 | 439/620.07 |
| 6,912,781 B2 * | 7/2005 | Morrison | H01F 27/292 | 29/592.1 |
| 6,962,511 B2 * | 11/2005 | Gutierrez | H01R 13/7172 | 439/490 |
| 6,986,684 B1 * | 1/2006 | Lien | H01R 24/64 | 439/620.07 |
| 7,326,084 B1 * | 2/2008 | Chen | H01R 13/6608 | 439/620.23 |
| 7,901,254 B2 * | 3/2011 | Dennes | H01R 9/2416 | 439/404 |
| 7,948,771 B2 * | 5/2011 | Zhang | H05K 5/0091 | 361/809 |
| 8,203,853 B2 * | 6/2012 | Chen | H01F 17/062 | 336/65 |
| 8,619,436 B2 * | 12/2013 | Zhang | H01F 27/027 | 174/520 |
| 8,854,167 B2 * | 10/2014 | Lin | H05K 5/0095 | 336/200 |
| 8,911,257 B2 * | 12/2014 | Kang | H01R 23/025 | 439/620.12 |
| 9,130,315 B2 * | 9/2015 | O'Malley | H01R 13/6469 | |
| 9,401,561 B2 * | 7/2016 | Zhou | H01R 13/518 | |
| 2003/0186586 A1 * | 10/2003 | Gutierrez | H01R 24/64 | 439/607.26 |
| 2011/0095847 A1 * | 4/2011 | Chen | H01F 17/062 | 333/175 |
| 2012/0154087 A1 * | 6/2012 | Chen | H01R 4/242 | 336/90 |
| 2013/0178104 A1 * | 7/2013 | Lin | H01R 9/22 | 439/626 |
| 2014/0349525 A1 * | 11/2014 | Gutierrez | H01R 13/6658 | 439/722 |
| 2015/0011126 A1 * | 1/2015 | Zhou | H01R 13/646 | 439/620.21 |
| 2015/0011131 A1 * | 1/2015 | Zhou | H01R 13/518 | 439/694 |
| 2016/0183400 A1 * | 6/2016 | Pan | H05K 5/03 | 361/752 |

* cited by examiner

FIG.11

ELECTRONIC DEVICE MOUNTING APPARATUS

CROSS-REFERENCE TO RELATED APPLICATION

This application claims priority of Taiwanese Patent Application No. 103207933, filed on May 7, 2014.

FIELD

The disclosure relates to an electronic device mounting apparatus, more particularly to an electronic device mounting apparatus adapted to be mounted with a plurality of electronic components.

BACKGROUND

Figure 1:
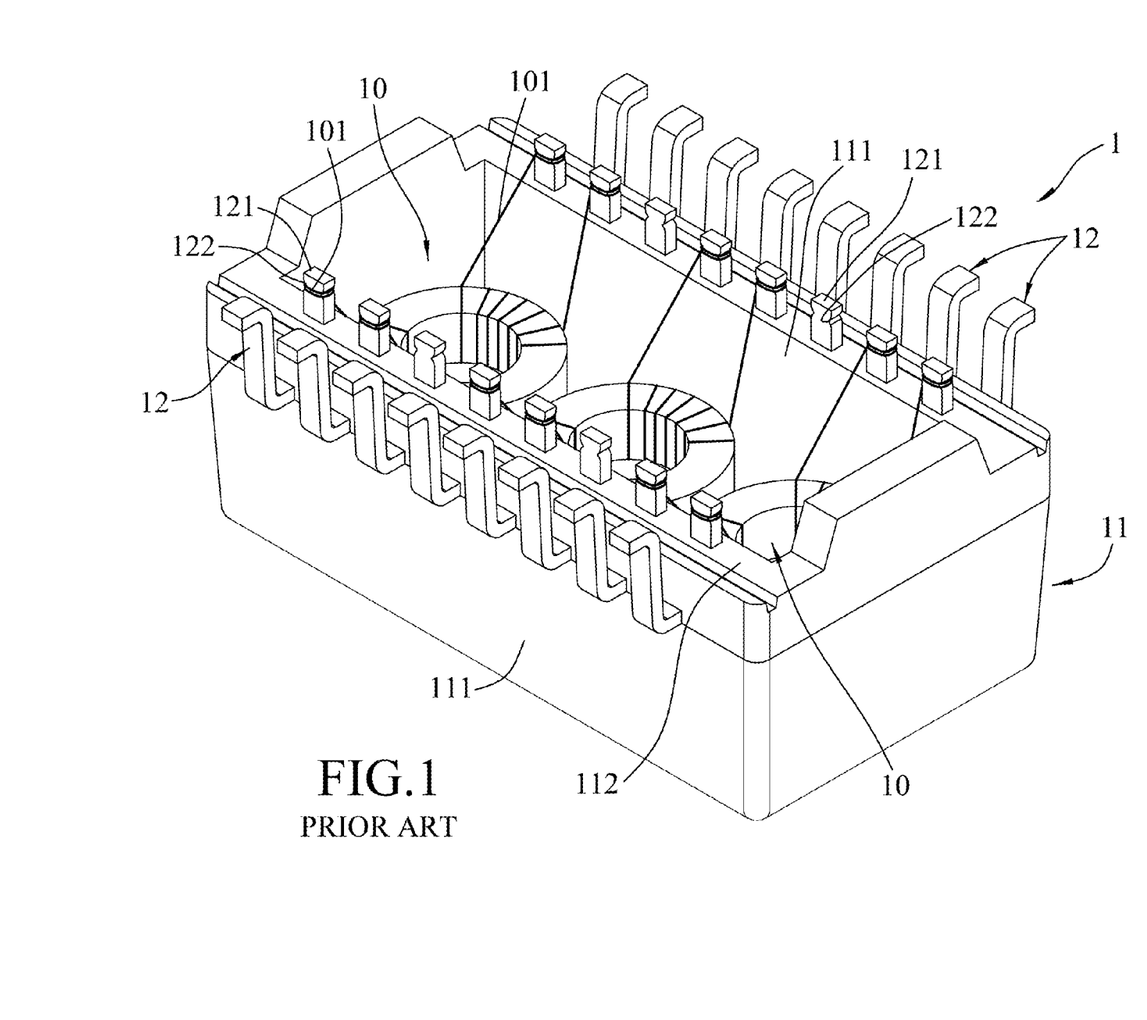
FIG. 1 is a perspective view of a conventional electronic device mounting apparatus.

Referring to FIG. 1, a conventional electronic device mounting apparatus 1 is used by being mounted with a plurality of electronic components 10. Each of the electronic components 10 includes at least one wire 101. The conventional electronic device mounting apparatus 1 includes a base unit 11 and a plurality of pin units 12. The base unit 11 includes two spaced-apart side walls 111, each of which has a top surface 112. The pin units 12 are mounted in the side walls 111 of the base unit 11 and are spaced apart from one another. Each of the pin units 12 has a wire-connecting segment 121 that projects from the top surface 112 of a corresponding one of the side walls 111. The wire-connecting segment 121 of each of the pin units 12 has an indented portion 122 that is recessed from a surface of the wire-connecting segment 121. The wire 101 of each of the electronic components 10 is entwined around the indented portion 122 of a corresponding one of the pin units 12.

When assembling the conventional electronic device mounting apparatus 1 with the electronic components 10, the electronic components 10 are orderly placed into an accommodating space of the electronic device mounting apparatus 1. Then, the wire 101 of each of the electronic components 10 is entwined around the indented portion 122 of the corresponding one of the pin units 12 and an excess part of the wire 101 is cut off. A tin welding process is performed to weld the wire 101 of each of the electronic components 10 to the wire-connecting segment 121 of the corresponding one of the pin units 12.

Although entwining the wires 101 around the indented portion 122 prevents detachment of the wires 101 from the wire-connecting portions 122, the entwining process is not only inconvenient and time-consuming, but prolongs the assembling procedure.

SUMMARY

Therefore, an object of the disclosure is to provide an electronic device mounting apparatus that can alleviate the drawback associated with the prior art.

An aspect of the present disclosure is to provide an electronic device mounting apparatus adapted to be mounted with a plurality of electronic components. Each of the electronic components includes at least one wire. The electronic device mounting apparatus includes a base unit and a plurality of pin units. The base unit includes a base wall and two side walls that extend transversely and respectively from two opposite sides of the base wall. Each of the side walls has a first surface distal from the base wall. The base wall and the side walls cooperatively define an accommodating space for receiving the electronic components therein. The pin units are correspondingly mounted in the side walls of the base unit and are spaced apart from one another. Each of the pin units has a wire-connecting segment that has a top surface opposite to the first surface of a corresponding one of the side walls, a connection portion that projects from the first surface, and two adjacent projecting portions that project from the connecting portion and that define the top surface. The projecting portions of the wire-connecting segment of each of the pin units define a slit therebetween. The slit extends from the top surface, terminates at the connection portion, and is adapted for the wire of a corresponding one of the electronic components to be clamped therein by the two adjacent projecting portions.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Before the disclosure is described in greater detail with reference to the accompanying embodiments, it should be noted herein that like elements are denoted by the same reference numerals throughout the disclosure.

Figure 2:
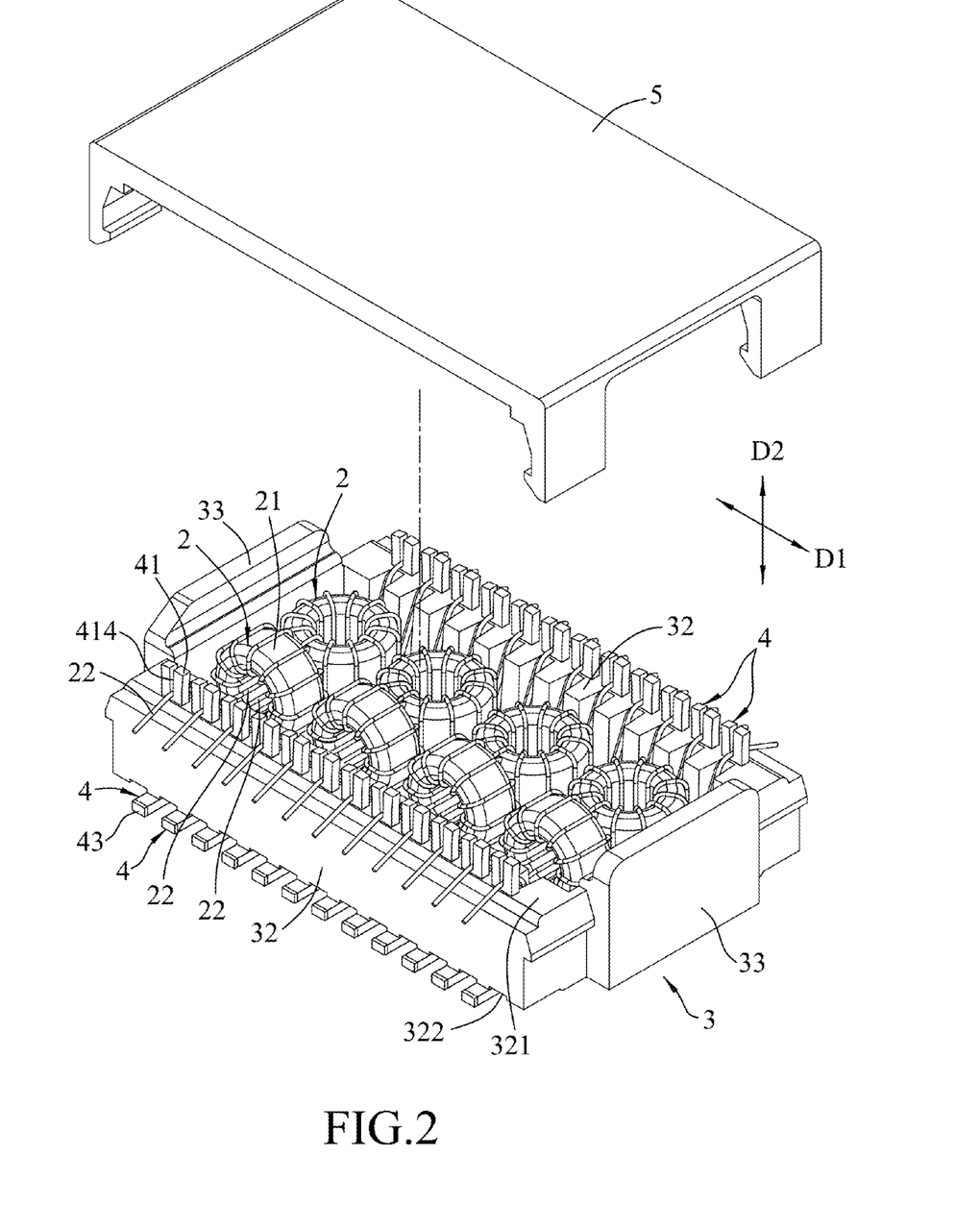
FIG. 2 is a partially exploded perspective view of a first embodiment of an electronic device mounting apparatus according to the present disclosure.
Figure 3:
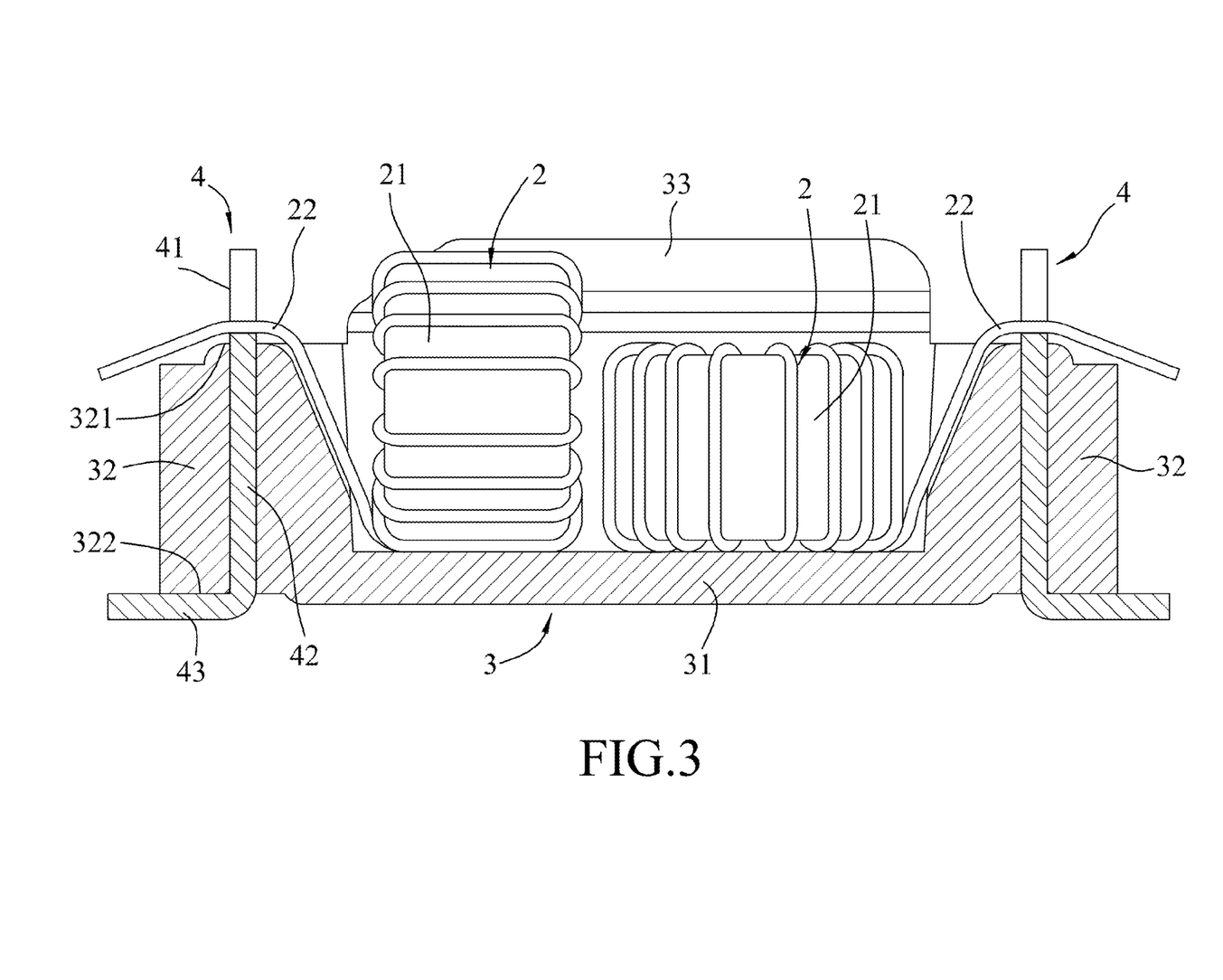
FIG. 3 is a schematic cross-sectional view of the first embodiment.
Figure 4:
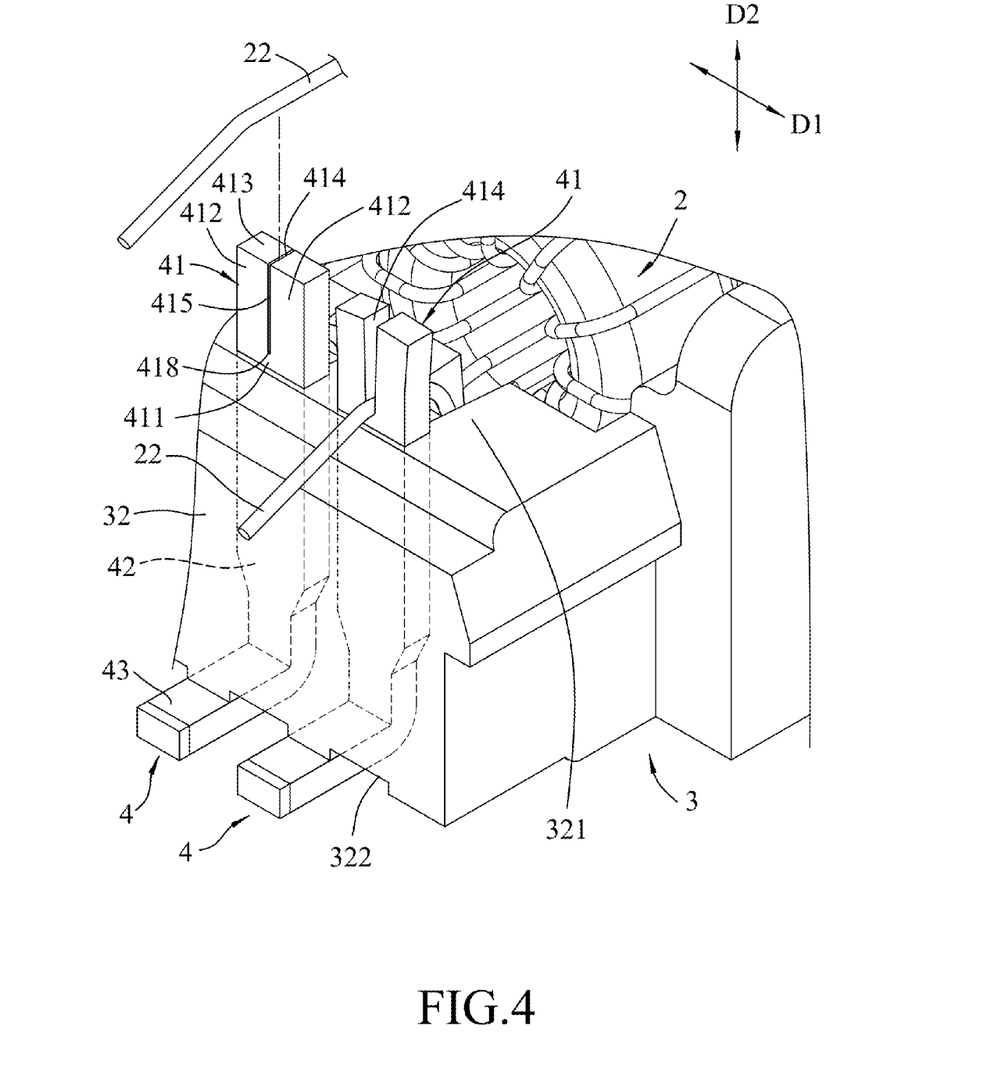
FIG. 4 is a partially exploded, fragmentary perspective view of the first embodiment.

Referring to FIGS. 2, 3 and 4, a first embodiment of an electronic device mounting apparatus according to the present disclosure is adapted to be mounted with a plurality of electronic components 2. Each of the electronic components 2 includes a hollow core 21 and two wires 22 that are wound on the hollow core 21 and that extend outwardly from the hollow core 21. The structure, type, number, arrangement and position of the electronic components 2 are not the essence of the present disclosure and may be changed according to practical needs, and further elaboration regarding the electronic components 2 will not be provided herein for the sake of brevity.

The electronic device mounting apparatus includes a base unit 3 made of an insulating plastic material, a plurality of pin units 4 made of an electrically conductive material, and a cover 5.

The base unit 3 has a U-shaped cross-section, and includes a base wall 31, two side walls 32 that extend transversely and respectively from two opposite long sides of the base wall 31, and two end walls 33 that extend transversely and respectively from two opposite short sides of the base wall 31 and that interconnect the two side walls 32. Each of the side walls 32 has a first surface 321 distal from the base wall 31, and a second surface 322 opposite to the first surface 321 and adjacent to the base wall 31. The base wall 31, the side walls 32 and the end walls 33 cooperatively define an accommodating space for receiving the electronic components 2 therein.

The pin units 4 are correspondingly mounted in the side walls 32 of the base unit 3 and are spaced apart from one another. Each of the pin units 4 has a wire-connecting segment 41 that projects from the first surface 321 of a corresponding one of the side walls 32, an embedded segment 42 that is connected to the wire-connecting segment 41 and that is embedded in the corresponding one of the side walls 32, and a protrusion segment 43 that is connected to and that bends from the embedded segment 42 and that extends outwardly from the second surface 322 of the corresponding one of the side walls 32. The wires 22 of each of the electronic components 2 are correspondingly and electrically connected to the wire-connecting segments 41 of the pin units 4. In practice, the shape of the pin units 4 may vary according to practical requirements and should not be limited by the first embodiment of the present disclosure.

Figure 5:
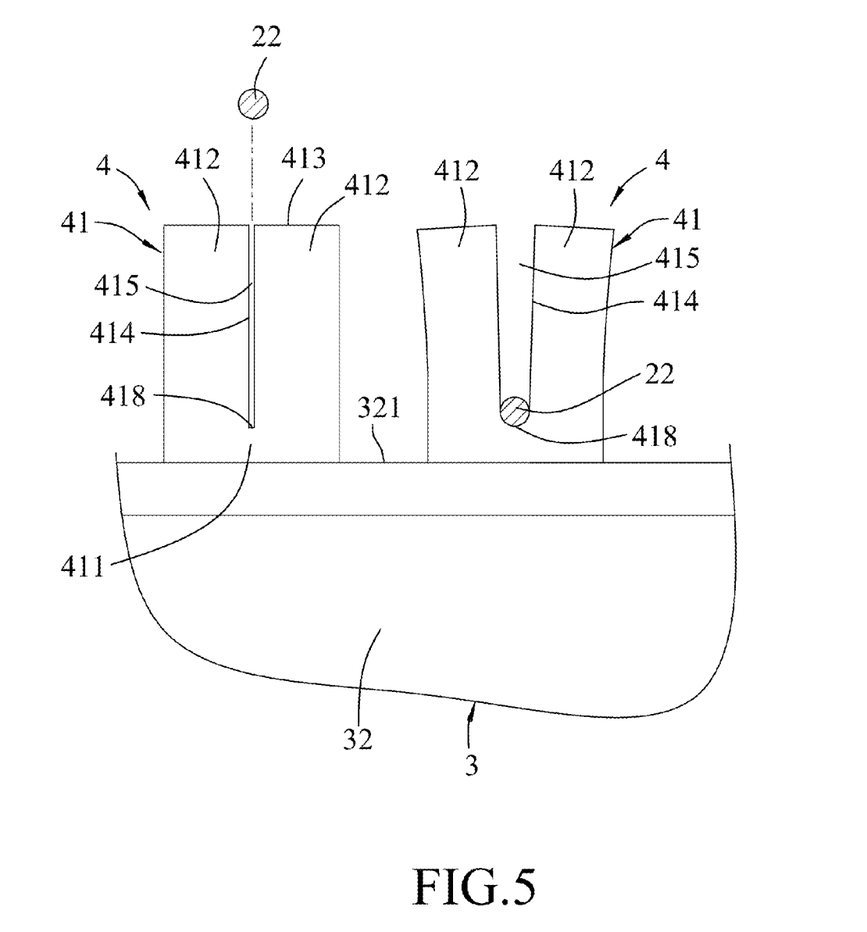
FIG. 5 is a partially exploded, fragmentary schematic view of the first embodiment.

Referring to FIGS. 3, 4 and 5, the wire-connecting segment 41 of each of the pin units 4 has a top surface 413 that is opposite to the first surface 321 of the corresponding one of the side walls 32, a connecting portion 411 that projects from the first surface 321, and two adjacent projecting portions 412 that project from the connecting portion 411 and define the top surface 413. The projecting portions 412 of the wire-connecting segment 41 of each of the pin units 4 define a slit 414 therebetween. The slit 414 extends from the top surface 413, terminates at the connecting portion 411, and is adapted for a corresponding one of the wires 22 of the electronic components 2 to be clamped therein by the two adjacent projecting portions 412. The projecting portions 412 of the wire-connecting segment 41 of each of the pin units 4 are aligned along a longitudinal direction (D1) (see FIGS. 2 and 4) of the side wall 32 such that the slit 414 faces the accommodating space of the base unit 3. The slit 414 has a passage portion 415 that is adapted for the corresponding one of the wires of the electronic components 2 to be squeezed therethrough and that has a width between the two adjacent projecting portions 412 being smaller than a diameter of the corresponding one of the wires 22. In the first embodiment, the passage portion 415 of the slit 414 is straight and vertical relative to the base unit 3.

When assembling the electronic device mounting apparatus 1 with the electronic components 2, the electronic components 2 are orderly placed onto the base wall 31 in the accommodating space. Then, an end portion of each of the wires 22 of the electronic components 2 is extended to the wire-connecting segment 41 of a corresponding one of the pin units 4 and pressed into the passage portion 415 of the slit 414 to rest tightly at a bottom end 418 of the slit 414.

Since the width between the two adjacent projecting portions 412 is smaller than the diameter of the corresponding one of the wires 22, the corresponding one of the wires 22 can be tightly clamped in the slit 414 by the two adjacent projecting portions 412. At this time, an excess part of the wires 22 maybe cut off and a tin welding process maybe conducted to weld the wires 22 to the pin units 4. An insulating material (not shown) may be filled in the accommodating space for securing and protecting the electronic components 2. Finally, the cover 5 (see FIG. 2) covers the base unit 3 to seal the electronic device mounting apparatus 1. The electronic device mounting apparatus 1 maybe mounted onto a circuit board with the protrusion segments 43 of the pin units 4 being correspondingly in contact with predetermined bonding pads of the circuit board. A tin welding process may be performed to weld the protrusion segments 43 of the pin units 4 with the corresponding bonding pads of the circuit board.

Figure 6:
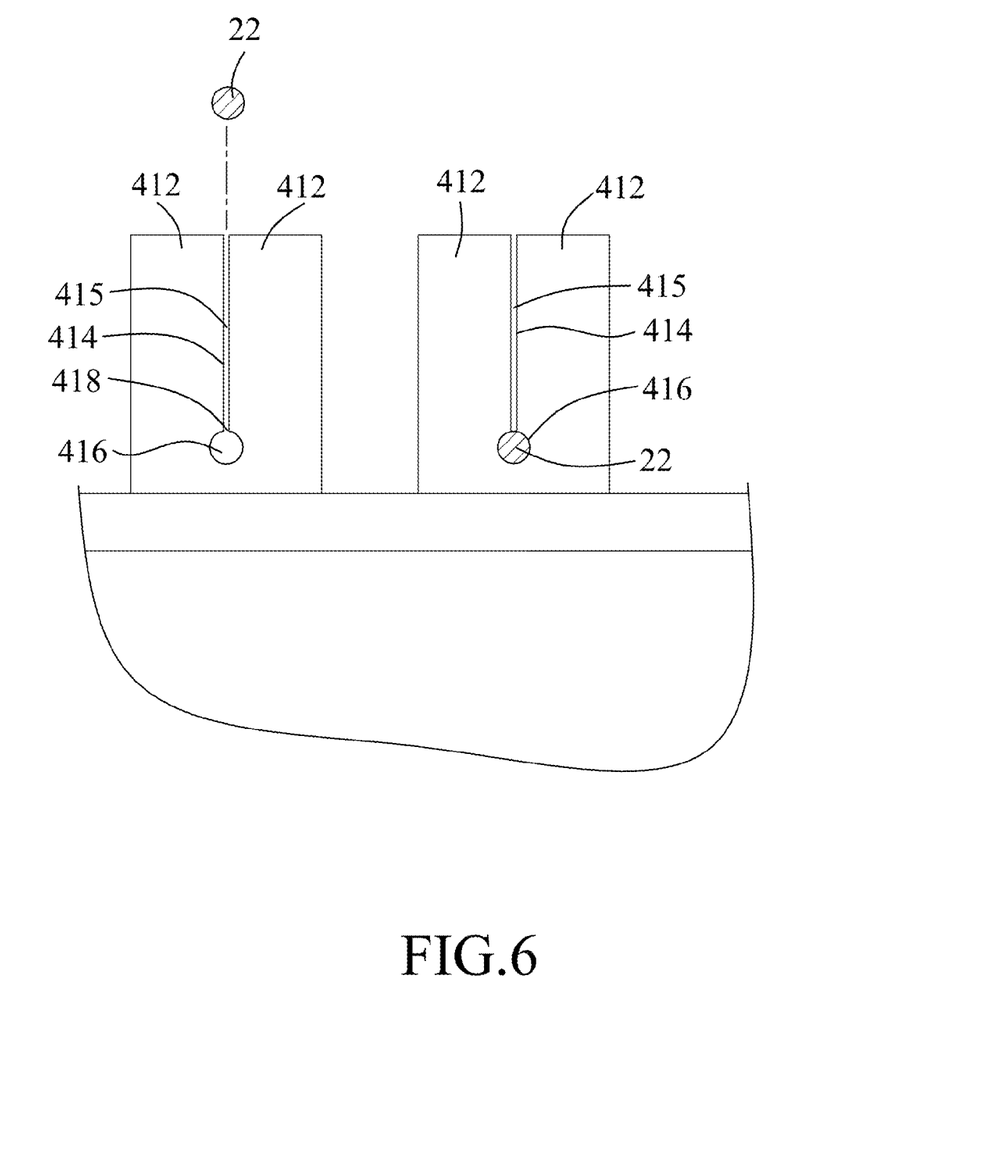
FIG. 6 is a partially exploded, fragmentary schematic view of a second embodiment of the electronic device mounting apparatus according to the present disclosure.

FIG. 6 illustrates a second embodiment of the electronic device mounting apparatus 1 according to the present invention. The second embodiment has a structure similar to that of the first embodiment, with the differences residing in the configuration of the slits 414. In the second embodiment, the slit 414 of each of the pin units 4 further has an enlarged hole portion 416 that is located between the bottom end 418 of the passage portion 415 and the connection portion 411, that is in spatial communication with the passage portion 415, and that has a diameter substantially identical to that of the corresponding one of the wires 22 of the electronic components 2. Thus, in this embodiment, the passage portion 415 of the slit 414 extends from the enlarged hole portion 416 and terminates at the top surface 413. The end portion of each of the wires 22 of the electronic components 2 is pressed into the passage portion 415 of the slit 414 of a corresponding one of the pin units 4 to rest in the enlarged hole portion 416. It should be noted that, after each of the wires 22 is situated in the enlarged hole portion 416 of the slit 414, the two adjacent projecting portions 412, that are forced away from each other during the pressing of the end portion of each of the wires 22 into the passage portion 415, return to their original positions so as to maintain the width of the slit 44 to be smaller than the diameter of the wire 22, thereby fixedly receiving each of the wires 22 in the slit 414 of the corresponding one of the pin units 4. Therefore, detachment of the wires 22 from the pin units 4 may be avoided, thereby increasing the reliability of electrical connection and decreasing the possibility of short circuit.

Figure 7:
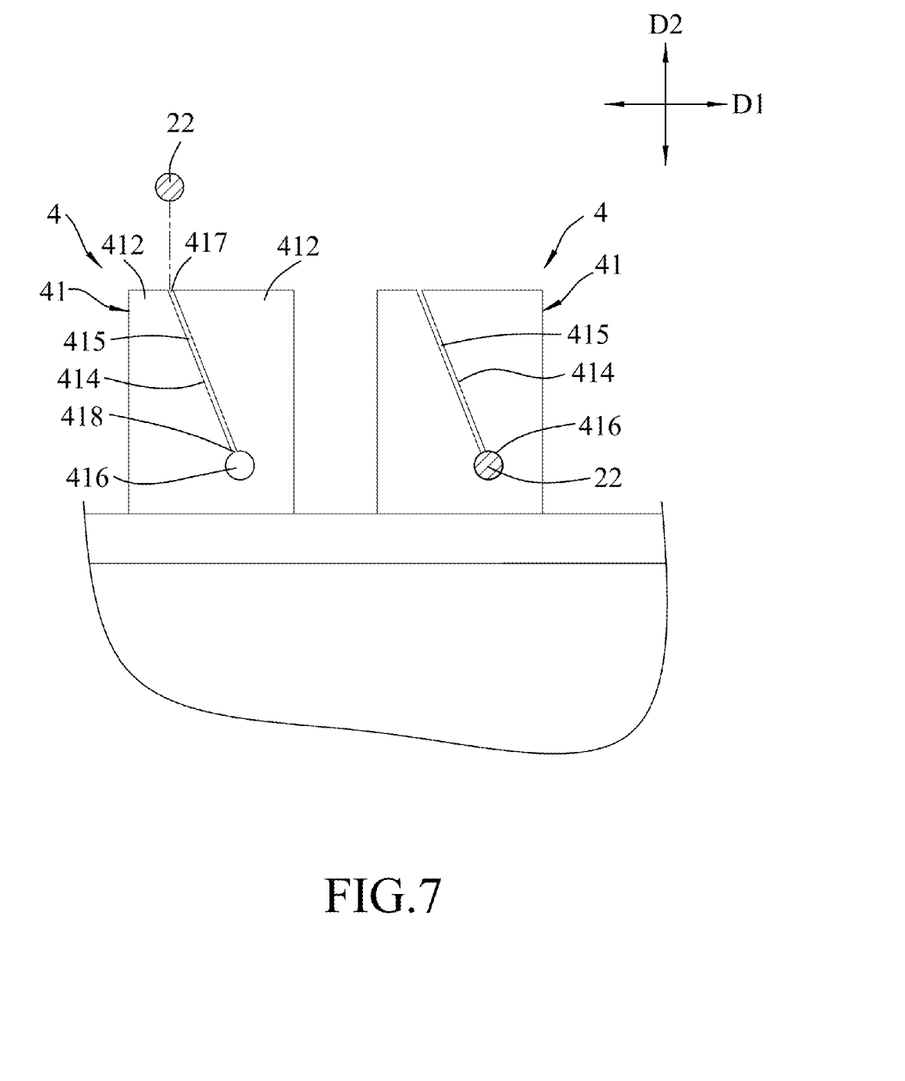
FIG. 7 is a partially exploded, fragmentary schematic view of a third embodiment of the electronic device mounting apparatus according to the present disclosure.

FIG. 7 illustrates a third embodiment of the electronic device mounting apparatus 1 according to the present invention. The third embodiment has a structure similar to that of the second embodiment, with the differences residing in the shape of the projecting portions 412 and therefore the shape of the slits 414. To be more specific, the passage portion 415 of the slit 414 of each of the pin units 4 is straight and inclined relative to the base unit 3. A top end 417 and the bottom end 418 of the passage portion 415 of the slit 414 are not aligned with each other in a vertical direction (D2) perpendicular to the longitudinal direction (D1). Therefore, detachment of the wires 22 from the pin units 4 may be avoided. It should be noted that the enlarged hole portions 416 may be omitted in this embodiment.

Figure 8:
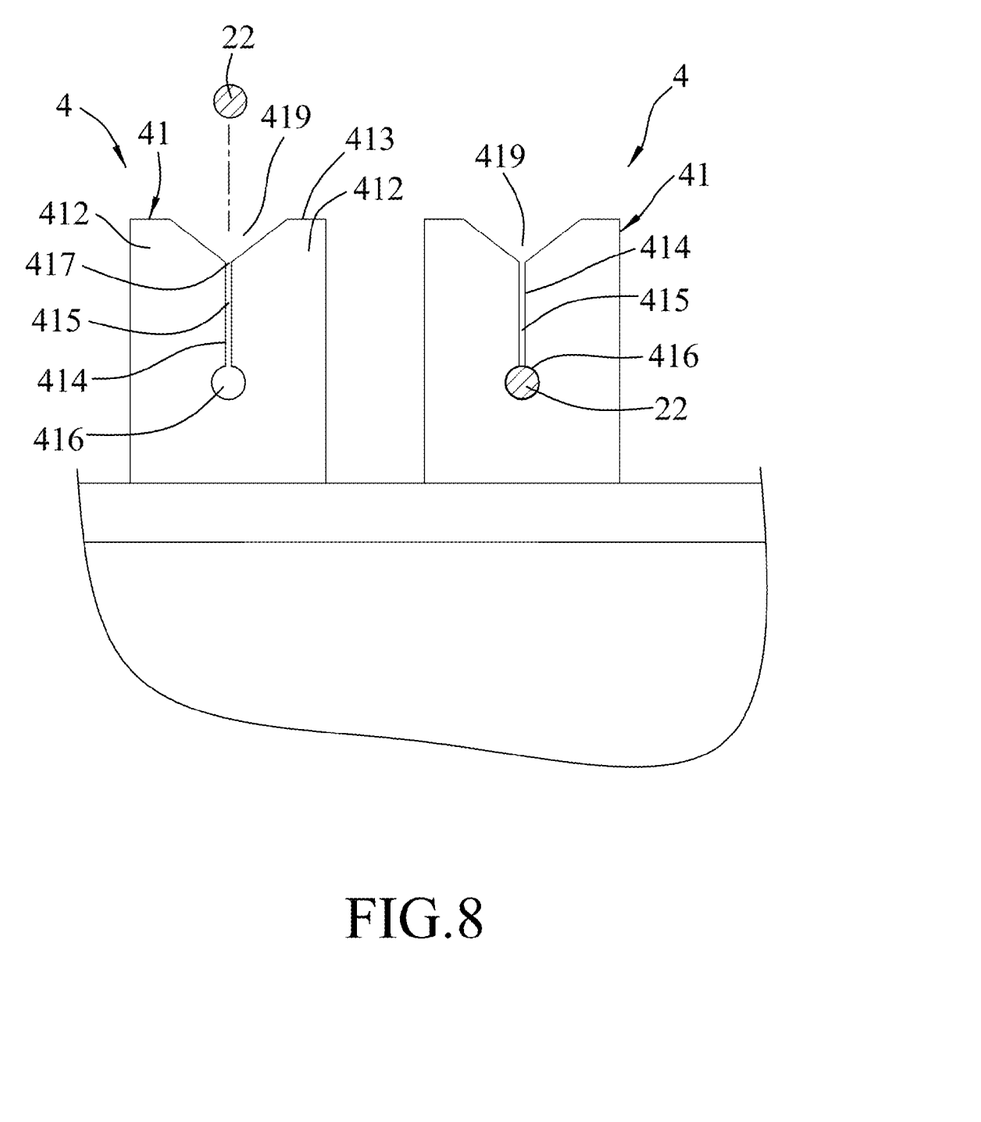
FIG. 8 is a partially exploded, fragmentary schematic view of a fourth embodiment of the electronic device mounting apparatus according to the present disclosure.

FIG. 8 illustrates a fourth embodiment of the electronic device mounting apparatus 1 according to the present invention. The fourth embodiment has a structure similar to that of the second embodiment, with the differences residing in the configuration of the pin units 4. In the fourth embodiment, the slit 414 of each of the pin units 4 further has a guide portion 419 that extends from and is in spatial communication with the passage portion 415 and that terminates at the top surface 413. That is, the passage portion 415 is located between the guide portion 419 and the enlarged hole portion 416. The guide portion 419 is tapered from the top surface 413 to the passage portion 415 for facilitating entrance of the corresponding one of the wires 22 into the passage portion 415. It should be noted that the enlarged hole portions 416 may be omitted in this embodiment.

Figure 9:
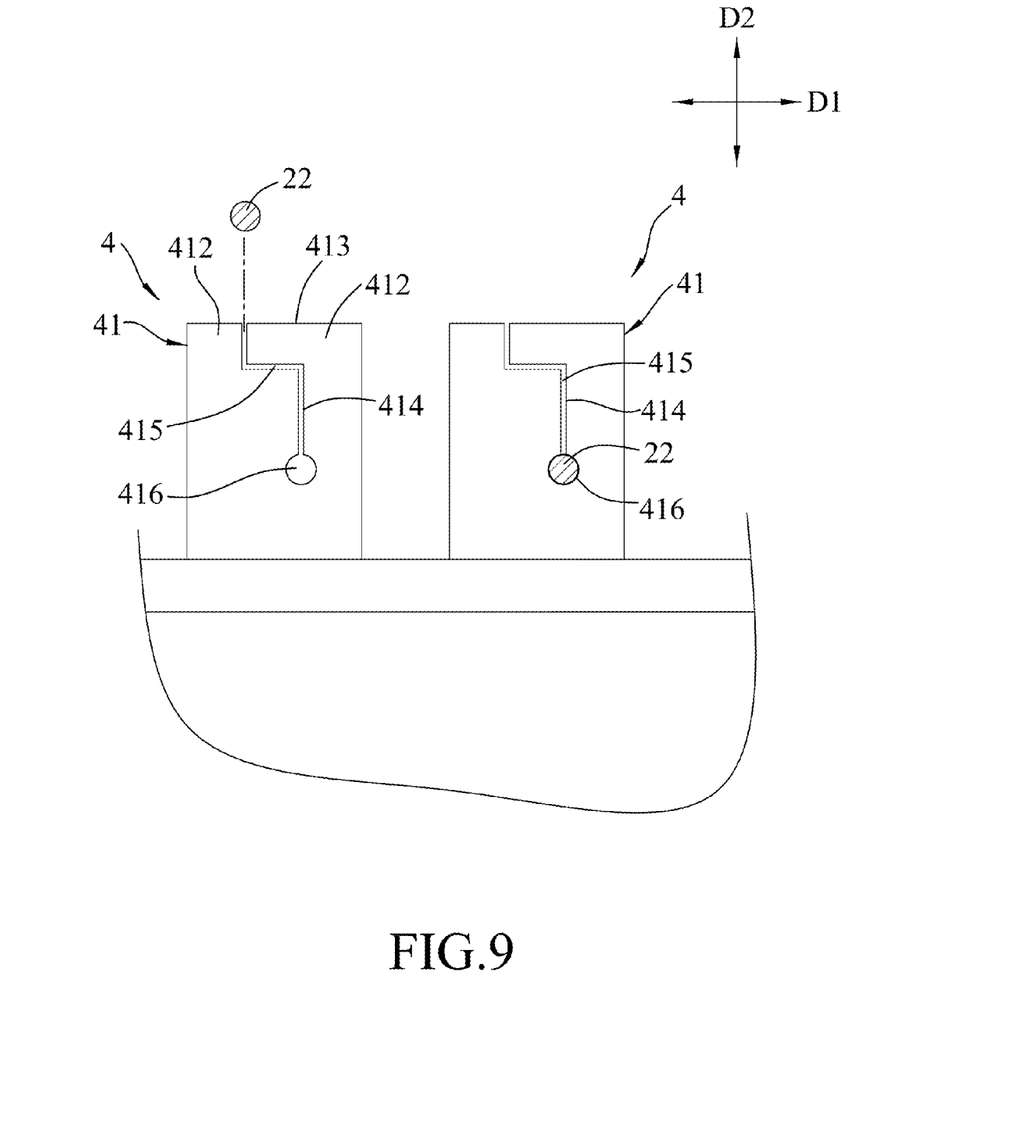
FIG. 9 is a partially exploded, fragmentary schematic view of a fifth embodiment of the electronic device mounting apparatus according to the present disclosure.

Besides the straight configuration of the slit 414 described in the aforesaid embodiments, the passage portion 415 of the slit 414 of each of the pin units 4 may meanderingly extend from the enlarged hole portion 416 toward the top surface 413. FIG. 9 illustrates a fifth embodiment of the electronic device mounting apparatus 1 according to the present invention. The fifth embodiment has a structure similar to that of the second embodiment, with the differences residing in the shape of the projecting portions 412 and the slits 414. In the fifth embodiment, the passage portion 415 extends from the enlarged hole portion 416 to the top surface 413 in a stair shape. To be more specific, the passage portion 415 extends vertically from the enlarged hole portion 416 along the vertical direction (D2), turns to extend in the longitudinal direction (D1), then turns again to extend in the vertical direction (D2), and terminates at the top surface 413. During assembly, each of the wires 22 is inserted into and passes through the meandering passage portion 415, and is received in the enlarged hole portion 416. With the structural configuration of the passage portion 415 in the fifth embodiment, detachment of the corresponding one of the wires 22 from the slit 414 can be prevented. It should be noted that the enlarged hole portions 416 may be omitted in this embodiment.

Figure 10:
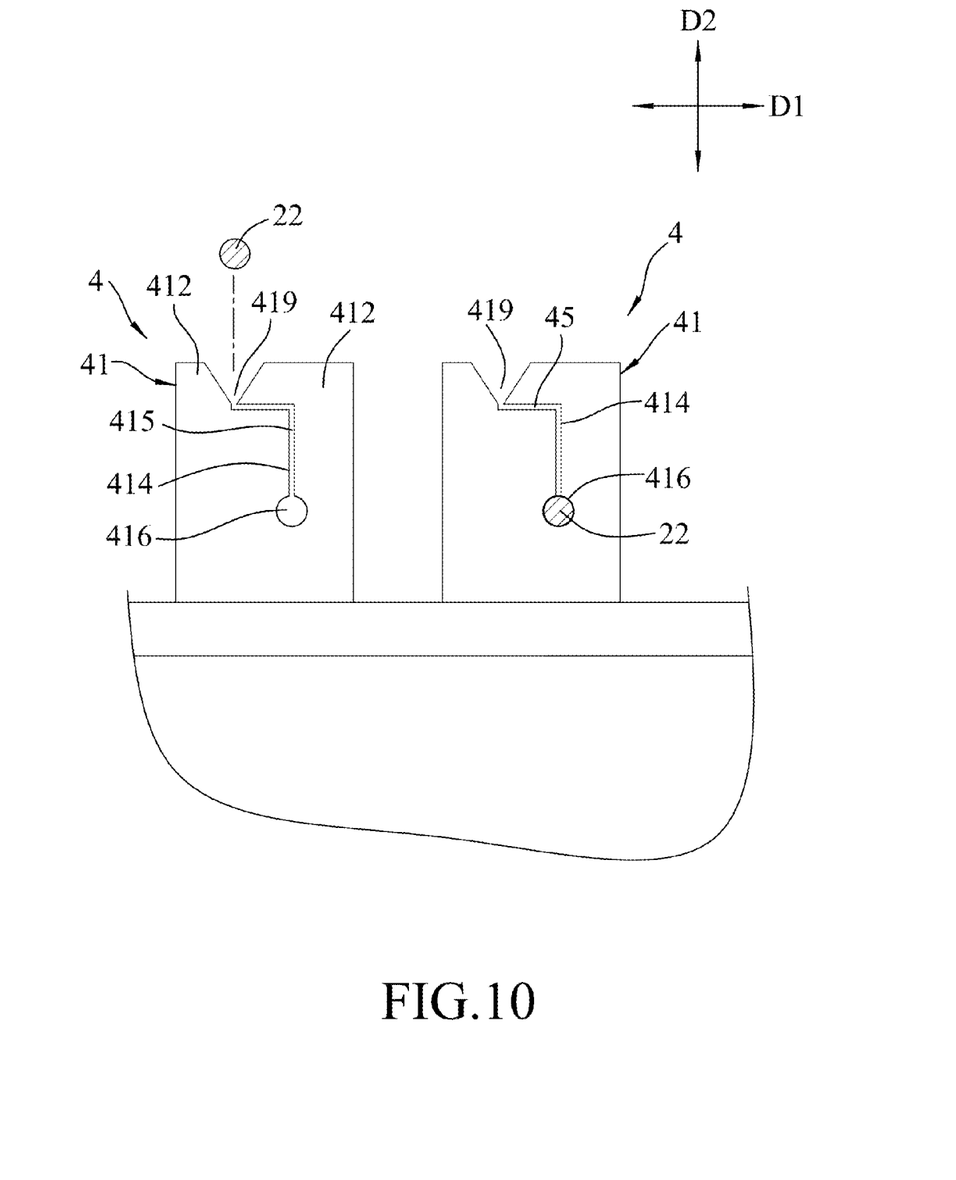
FIG. 10 is a partially exploded, fragmentary schematic view of a sixth embodiment of the electronic device mounting apparatus according to the present disclosure.

FIG. 10 illustrates a sixth embodiment of the electronic device mounting apparatus 1 according to the present invention. The sixth embodiment has a structure similar to that of the fourth embodiment, with the differences residing in the configuration of the passage portion 415. In the sixth embodiment, the passage portion 415 extends vertically from the enlarged hole portion 416 along the vertical direction (D2), then turns to extend in the longitudinal direction (D1), and terminates at the guide portion 419, i.e., in an L-shape. It should be noted that the enlarged hole portions 416 may be omitted in this embodiment.

Figure 11:
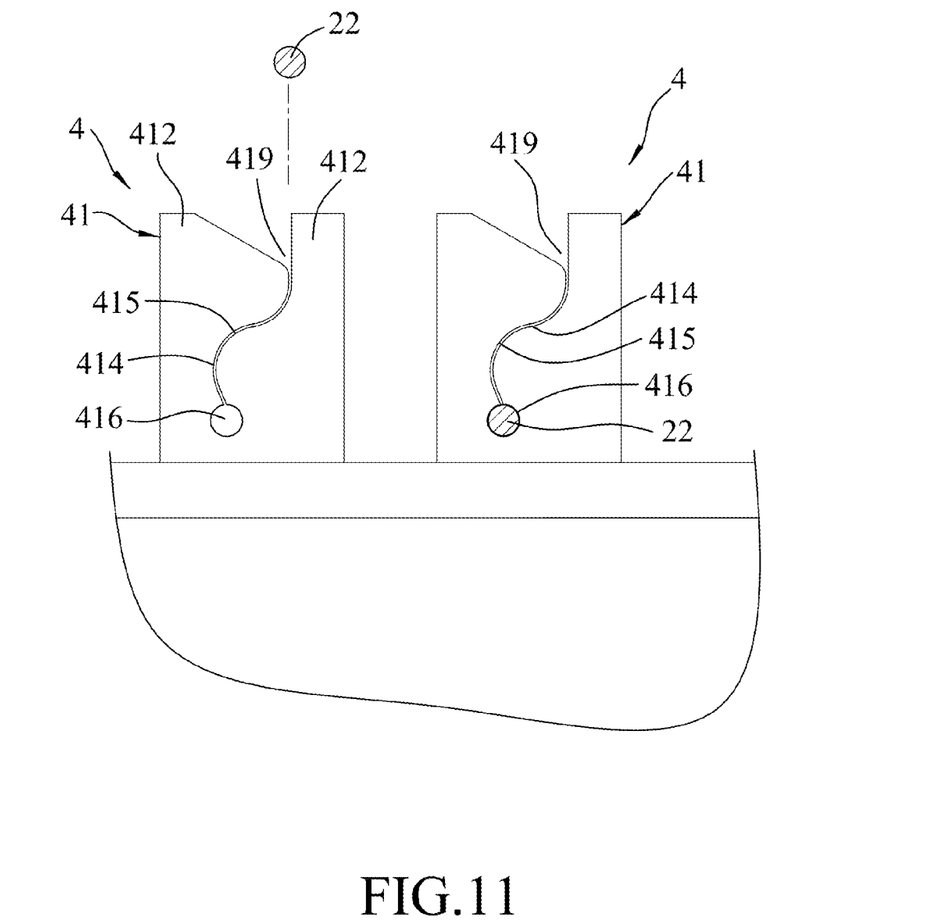
FIG. 11 is a partially exploded, fragmentary schematic view of a seventh embodiment of the electronic device mounting apparatus according to the present disclosure.

FIG. 11 illustrates a seventh embodiment of the electronic device mounting apparatus 1 according to the present invention. The seventh embodiment has a structure similar to that of the fourth embodiment, with the differences residing in the configuration of the passage portion 415. In the seventh embodiment, the passage portion 415 extends from the enlarged hole portion 416 in an S-shape and terminates at the guide portion 419. It should be noted that the enlarged hole portions 416 may be omitted in this embodiment.

To sum up, with the two adjacent projecting portions 412 that define the slit 414, the corresponding one of the wires 22 can be firmly clamped by the two adjacent projecting portions 412. The process of assembling the electronic device mounting apparatus 1 with the electronic components 2 is therefore be simplified, thereby improving the production yield and reducing the costs involved.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An electronic device mounting apparatus adapted to be mounted with a plurality of electronic components, each of the electronic components including at least one wire, said electronic device mounting apparatus comprising:
    a base unit including a base wall and two side walls that extend transversely and respectively from two opposite sides of said base wall, each of said side walls having a first surface distal from said base wall, said base wall and said side walls cooperatively defining an accommodating space for receiving the electronic components therein; and
    a plurality of pin units being correspondingly mounted in said side walls of said base unit and being spaced apart from one another, each of said pin units having a wire-connecting segment that has a top surface opposite to said first surface of a corresponding one of said side walls, a connection portion that projects from said first surface, and two adjacent projecting portions that project from said connection portion and that define said top surface, said projecting portions of said wire-connecting segment of each of said pin units defining a slit therebetween, said slit extending from said top surface, terminating at said connection portion, and being adapted for the wire of a corresponding one of the electronic components to be clamped therein by said two adjacent projecting portions,
    wherein said slit of each of said pin units has a passage portion that is adapted for the wire of a corresponding one of the electronic components to be squeezed therethrough and that has a width between two adjacent projecting portions being smaller than a diameter of the wire, and
    wherein said slit further has an enlarged hole portion that is located between said passage portion and said connection portion that is in spatial communication with said passage portion, and that has a diameter substantially identical to that of the wire of a corresponding one of the electronic components.

2. The electronic device mounting apparatus as claimed in claim 1, wherein said passage portion of said slit extends from said enlarged hole portion and terminates at said top surface.

3. The electronic device mounting apparatus as claimed in claim 1, wherein said slit of each of said pin units further has a guide portion that extends from and is in spatial communication with said passage portion and that terminates at said top surface, said guide portion being tapered from said top surface to said passage portion for facilitating entrance of the wire of a corresponding one of the electronic components into said passage portion.

4. The electronic device mounting apparatus as claimed in claim 2, wherein said projecting portions of said wire-connecting segment of each of said pin units are aligned along a longitudinal direction (D1) of the corresponding one of said side walls such that said slit faces said accommodating space of said base unit.

5. The electronic device mounting apparatus as claimed in claim 4, wherein said passage portion of said slit of each of said pin units is straight and vertical relative to said base unit.

6. The electronic device mounting apparatus as claimed in claim 4, wherein said passage portion of said slit of each of said pin units is straight and inclined relative to said base unit.

7. The electronic device mounting apparatus as claimed in claim 4, wherein said passage portion of said slit of each of said pin units meanderingly extends from said enlarged hole portion to said top surface.

8. The electronic device mounting apparatus as claimed in claim 7, wherein said passage portion extends from said enlarged hole portion to said top surface in a stair shape.

9. The electronic device mounting apparatus as claimed in claim 3, wherein said projecting portions of said wire-connecting segment of each of said pin units are aligned along a longitudinal direction (D1) of the corresponding one of said side walls such that said slit faces said accommodating space of said base unit.

10. The electronic device mounting apparatus as claimed in claim 9, wherein said passage portion of said slit of each of said pin units is straight and vertical relative to said base unit.

11. The electronic device mounting apparatus as claimed in claim 9, wherein said passage portion of said slit of each of said pin units meanderingly extends from said enlarged hole portion to said guide portion.

12. The electronic device mounting apparatus as claimed in claim 11, wherein said passage portion of each of said pin units extends from said enlarged hole portion to said guide portion in an L-shape.

13. The electronic device mounting apparatus as claimed in claim 11, wherein said passage portion extends from said enlarged hole portion to said guide portion in an S-shape.

14. The electronic device mounting apparatus as claimed in claim 1, wherein each of said side walls of said base unit has a second surface opposite to said first surface, each of said pin units further has an embedded segment that is connected to said wire-connecting segment and that is embedded in a corresponding one of said side walls, and a protrusion segment that extends from said embedded member and outwardly of said second surface of said corresponding one of said side walls.

* * * * *